(12) United States Patent
Sheu

(10) Patent No.: US 6,882,002 B2
(45) Date of Patent: Apr. 19, 2005

(54) NON-VOLATILE SEMICONDUCTOR MEMORY DEVICE HAVING A DIELECTRIC LAYER FORMED AROUND AND PLANAR WITH A FIRST STACK'S TOP SURFACE

(75) Inventor: Bor-Ru Sheu, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 10/397,632

(22) Filed: Mar. 25, 2003

(65) Prior Publication Data

US 2004/0005759 A1 Jan. 8, 2004

(30) Foreign Application Priority Data

Jul. 2, 2002 (TW) ........................................ 91114667 A

(51) Int. Cl.⁷ .............................................. H01L 29/72
(52) U.S. Cl. ...................................... 257/316; 257/319
(58) Field of Search ................................ 257/315, 316, 257/319, 320; 438/211, 257

(56) References Cited

U.S. PATENT DOCUMENTS

| | | | |
|---|---|---|---|
| 5,962,890 A | 10/1999 | Sato ........................... 257/320 |
| 6,172,912 B1 | 1/2001 | Hirano et al. ........... 365/185.28 |
| 6,185,131 B1 | 2/2001 | Kouchi ..................... 365/185.2 |
| 6,215,699 B1 | 4/2001 | Yamamoto ............. 365/185.09 |
| 6,410,443 B1 * | 6/2002 | Avanzino et al. ............ 438/693 |
| 6,420,752 B1 * | 7/2002 | Ngo et al. ................... 257/315 |
| 6,475,857 B1 * | 11/2002 | Kim et al. ................... 438/240 |
| 6,476,439 B1 * | 11/2002 | Chen ........................... 257/315 |

* cited by examiner

*Primary Examiner*—Anh Duy Mai
(74) *Attorney, Agent, or Firm*—Haverstock & Owens LLP

(57) ABSTRACT

The structure and manufacturing method of a non-volatile semiconductor memory device are provided. The method for manufacturing a cell stack includes steps of: (a) providing a substrate; (b) forming on the substrate an oxide layer, a first conductive layer, a first dielectric layer, and a second conductive layer sequentially; (c) etching back to form a first recess pattern; (d) filling with a second dielectric layer; (e) depositing a third dielectric layer; (f) depositing a fourth dielectric layer; (g) etching to form a second recess pattern; (h) depositing a barrier layer on the second recess pattern; and (i) filling with a third conductive layer. The proposed structure of a cell stack includes a substrate, an oxide layer, a first stack, a second dielectric layer, a second stack, a third dielectric layer, and a fourth dielectric layer.

11 Claims, 4 Drawing Sheets

NON-VOLATILE SEMICONDUCTOR MEMORY DEVICE HAVING A DIELECTRIC LAYER FORMED AROUND AND PLANAR WITH A FIRST STACK'S TOP SURFACE

FIELD OF THE INVENTION

The present invention is related to the structure and the manufacturing method of non-volatile semiconductor memory device. More specifically, this invention includes the structure and the manufacturing method of the control gates (CG) and the word-lines (WL) of the memory cell arrays in a non-volatile semiconductor memory device, such as a flash memory.

BACKGROUND OF THE INVENTION

The prior arts of flash memory devices, such as the ETOX™ flash memories of Intel and/or contact-less flash memories of other companies, have utilized the structure of Floating Gate/ONO dielectric/Control Gate stack in the memory cell. Please refer to FIG. 1, wherein the manufacturing processes of forming a semi-conductor structure like a flash memory using conventional hard-masking etching scheme will include steps of: (a) providing a substrate 200; (b) forming on the substrate an oxide layer 201, a first conductive layer 202, a first dielectric layer 203, a second conductive layer 204, and a second dielectric layer 205 sequentially; (c) etching the second dielectric layer 205, the second conductive layer 204, the first dielectric layer 203, and the first conductive layer 202 for forming a first recess pattern 206, and so on. The sizes of the memory cells are measured by the widths of the first recess patterns 206 or the widths of the word-lines 207. These prior arts have encountered issues while attempting to scale down the sizes of such memory cells to the 0.18/0.13/0.1 um generations. For example, high aspect ratio has been encountered in etching the FG/ONO/CG stack, requiring the introduction of hard-mask etching scheme. It has encountered therefore even higher aspect ratio in the gap-filling of memory cells after FG/ONO/CG etching steps. Scaling of flash memory cells requires new structure and integration scheme of forming the FG/ONO/CG stack and associated word-lines, which connect the control gates in a flash memory cell array. Another issue accompanied with the scaling of flash memory cell is that the word-line resistance will increase substantially as the device scaled down to 0.13/0.1 um generations if using the conventional doped poly-Si (with Ti Salide or Co Salide) or W-polycide as the materials of control gates and word-lines. A low resistance material like W or AlCu shall be introduced as the word-lines and therefore it requires a new structure and integration scheme of forming the control gates and word-lines in a flash memory cell arrays. The Patents related to the prior arts include: U.S. Pat. Nos. 6,172,912, 6,215,699, 6,185,131, and 5,962,890.

Employing W/TiN/Doped-Poly-Si stack as the control gates and word-lines in non-volatile memory cell arrays, a scalable structure and an integration scheme with word-lines of low resistance could be formed. Utilizing the doped-poly-Si/ONO/thin doped-poly-Si stack while performing the etching and gap-filling of the FG/ONO/CG cell stacks could create easier processes with lower aspect ratios compared to conventional W-polycide with hard-mask processes. Also, the aspect ratio of field isolation implant (using contact-less cells) is decreased in the proposed scheme.

Keeping the drawbacks of the prior arts in mind, and employing experiments and research full-heartily and persistently, the structure and the manufacturing method of non-volatile semiconductor memory device are finally conceived by the applicant.

SUMMARY OF THE INVENTION

It is therefore an object of the present invention to propose a method for manufacturing a cell stack.

It is therefore another object of the present invention to propose a structure of a cell stack.

According to the aspect of the present invention, the method for manufacturing a cell stack includes steps of: (a) providing a substrate; (b) forming on the substrate an oxide layer, a first conductive layer, a first dielectric layer, and a second conductive layer sequentially; (c) etching the first conductive layer, the first dielectric layer, and the second conductive layer for forming a first recess pattern; (d) filling the first recess pattern with a second dielectric layer on substrate; (e) depositing a third dielectric layer on the second conductive layer and the second dielectric layer; (f) depositing a fourth dielectric layer on the third dielectric layer; (g) etching the third dielectric layer and the fourth dielectric layer to form a second recess pattern on the second conductive layer; (h) depositing a barrier layer on an inner surface of the second recess pattern on the second conductive layer; and (i) filling the second recess pattern with a third conductive layer.

Preferably, the substrate is a silicon substrate.

Preferably, the first conductive layer is one selected from a group consisting of poly-silicon, amorphous silicon, and polycide.

Preferably, the first dielectric layer is an ONO layer.

Preferably, the second conductive layer is one selected from a group consisting of poly-silicon, amorphous silicon, and polycide.

Preferably, the oxide layer is a gate oxide.

Preferably, the step (d) further includes a step (d') of depositing a second dielectric layer and then etching back.

Preferably, the second dielectric layer is borophosphosilicate glass (BPSG).

Preferably, the step (i) further includes a step (i') of depositing a third conductive layer and then etching back.

Preferably, the barrier layer is one of TiN, and a stack of TiN and Ti.

Preferably, the third dielectric layer is one of silicon nitride, and silicon-oxy-nitride.

Preferably, the fourth dielectric layer is tetra-ethyl-ortho-silicate (TEOS) oxide.

Preferably, the first recess pattern is a second dielectric layer.

Preferably, the third conductive layer is one selected from a group consisting of W, Al—Cu, Cu, TiSi, TiN, TaSi, TaN, WN, and WNSi.

According to another aspect of the present invention, a cell stack includes a substrate, an oxide layer, a first stack having a first conductive layer, a first dielectric layer and a second conductive layer, a second dielectric layer deposited around the first stack, a second stack having a third conductive layer and a barrier layer connected to the first stack, and a third dielectric layer deposited around the second stack.

Preferably, the substrate is a silicon substrate.

Preferably, the oxide layer is a gate oxide.

Preferably, the first conductive layer is one selected from a group consisting of poly-silicon, amorphous silicon, and polycide.

Preferably, the second conductive layer is one selected from a group consisting of poly-silicon, amorphous silicon, and polycide.

Preferably, the cell stack further includes a first dielectric layer deposited between the first conductive layer and the second conductive layer.

Preferably, the first dielectric layer is an ONO layer.

Preferably, the third dielectric layer is one of silicon nitride and silicon-oxy-nitride.

Preferably, the third conductive layer is one selected from a group consisting of W, Al—Cu, Cu, TiSi, TiN, TaSi, TaN, WN, and WNSi.

Preferably, the barrier layer is one of TiN and a stack of TiN and Ti.

Preferably, the fourth dielectric layer is tetra-ethyl-orthosilicate (TEOS) oxide.

DETAILED DESCRIPTION OF THE PREFERRED EMBODIMENT

Figure 1:
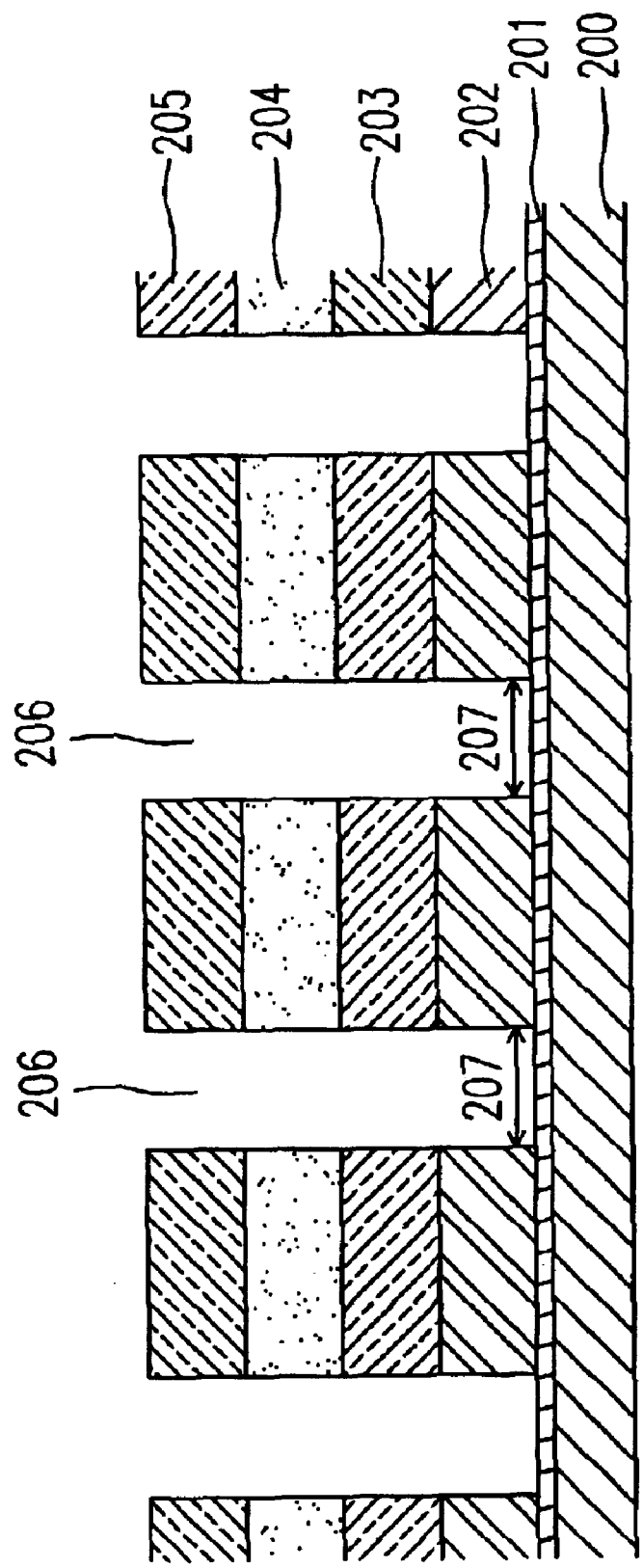
FIG. 1 is the schematic diagram of the manufacturing processes of forming a semi-conductor structure using the conventional hard-masking etching scheme to form the recess patterns.
Figure 2:
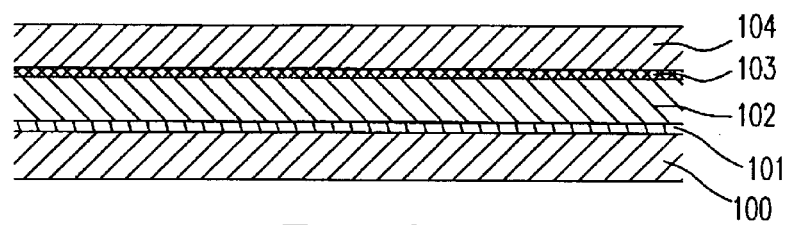
FIG. 2 is the schematic diagram of the manufacturing processes of forming a semi-conductor structure using the proposed scheme to provide a substrate, and to form on the substrate an oxide layer, a first conductive layer, a first dielectric layer, and a second conductive layer sequentially.

Please refer to FIG. 2. It shows the manufacturing processes of forming a semi-conductor structure using the proposed scheme to provide a substrate 100, and to form on the substrate an oxide layer 101, a first conductive layer 102, a first dielectric layer 103, and a second conductive layer 104 sequentially.

Figure 3:
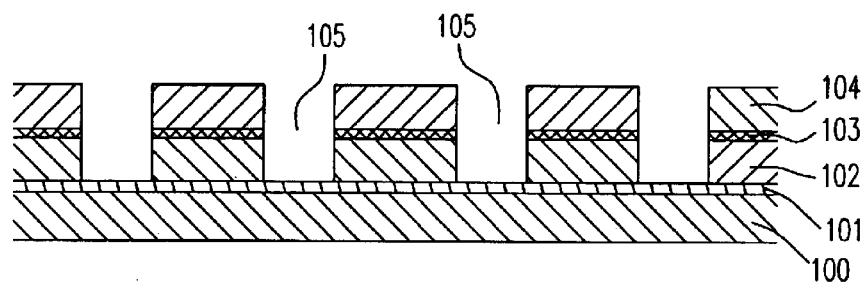
FIG. 3 is the schematic diagram of the manufacturing processes of forming a semi-conductor structure using the proposed scheme to etch the second conductive layer, the first dielectric layer, and the first conductive layer for forming a first recess pattern.

Please refer to FIG. 3. It shows the manufacturing process of forming a semi-conductor structure using the proposed method to etch the second conductive layer 104, the first conductive layer 103, and the first dielectric layer 102 for forming a first recess pattern 105.

Figure 4:
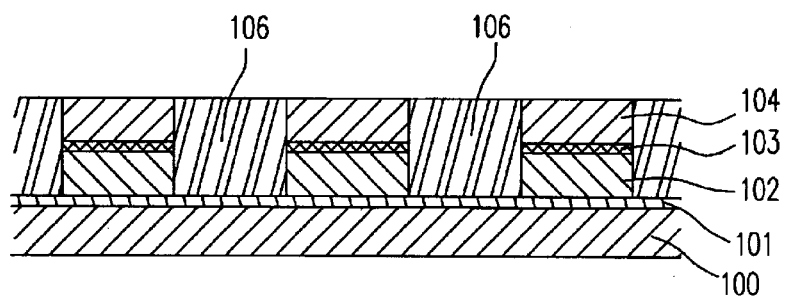
FIG. 4 is the schematic diagram of the manufacturing processes of forming a semi-conductor structure using the proposed scheme to fill the first recess pattern with a second dielectric layer on the oxide layer.

Please refer to FIG. 4. It shows the manufacturing process of forming a semi-conductor structure using the proposed method to fill the first recess pattern 105 with a second dielectric layer 106 on the oxide layer 101.

Figure 5:
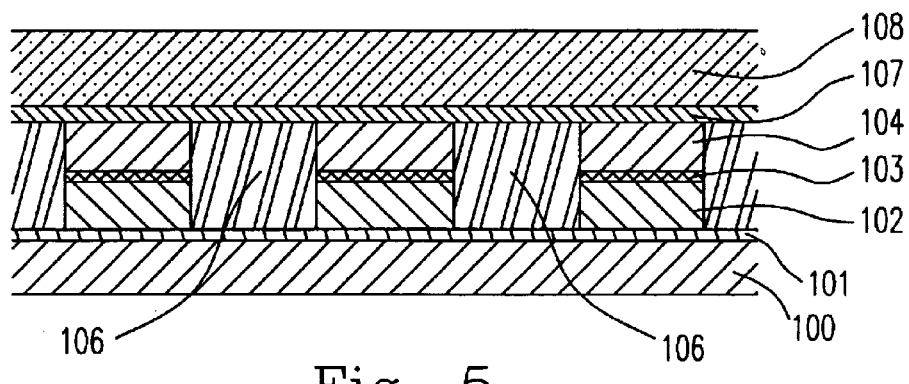
FIG. 5 is the schematic diagram of the manufacturing processes of forming a semi-conductor structure using the proposed scheme to deposit a third dielectric layer on the second conductive layer and the second dielectric layer, and to deposit a fourth dielectric layer on the third dielectric layer.

Please refer to FIG. 5. It shows the manufacturing processes of forming a semi-conductor structure using the proposed method to deposit a third dielectric layer 107 on the second conductive layer 104 and the second dielectric layer 105, and to deposit a fourth dielectric layer 108 on the third dielectric layer 107.

Figure 6:
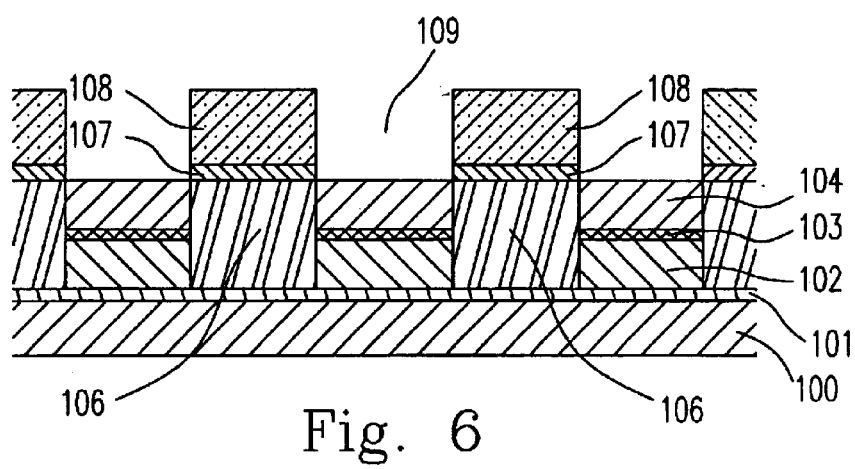
FIG. 6 is the schematic diagram of the manufacturing processes of forming a semi-conductor structure using the proposed scheme to etch the fourth dielectric layer and the third dielectric layer, and to form a second recess pattern on the second conductive layer.

Please refer to FIG. 6. It shows the manufacturing processes of forming a semi-conductor structure using the proposed method to etch the fourth dielectric layer 108 and the third dielectric layer 107, and to form a second recess pattern 109 on the second conductive layer 104.

Figure 7:
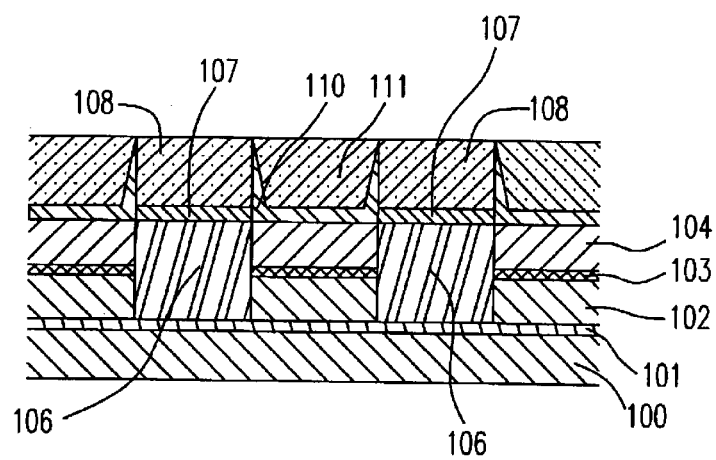
FIG. 7 is the schematic diagram of the manufacturing processes of forming a semi-conductor structure using the proposed scheme to deposit a barrier layer on an inner surface of the second recess pattern on the second conductive layer, and to fill the second recess pattern with a third conductive layer.

Please refer to FIG. 7. It shows the manufacturing processes of forming a semi-conductor structure using the proposed method to deposit a barrier layer 110 on an inner surface of the second recess pattern 109 on the second conductive layer 104, and to fill the second recess pattern 109 with a third conductive layer 111.

Please refer to FIG. 7. It shows a semi-conductor structure manufactured according to the proposed method. The substrate 100 is a silicon substrate, and the first conductive layer 102 is a floating gate (FG). The first conductive layer 102 is one selected from a group consisting of poly-silicon, amorphous silicon, and polycide. The first dielectric layer 103 is an ONO layer. The second conductive layer 104 is a control gate (CG). The second conductive layer 104 is one selected from a group consisting of poly-silicon, amorphous silicon, and polycide. The oxide layer 101 is a gate oxide. The manufacturing process of filling the first recess pattern 105 with a second dielectric layer 106 on the oxide layer 101 further includes processes of depositing a second dielectric layer 106 and then etching back. The second dielectric layer 106 is borophosphosilicate glass (BPSG). The manufacturing process of filling the second recess pattern 109 further includes processes of depositing a third conductive layer 111 and then etching back. The barrier layer 110 is a barrier metal layer for connecting the second conductive layer 104 and the third conductive layer 111. The barrier layer 110 is TiN. The barrier layer 110 includes TiN and Ti. The third dielectric layer 107 is an etching-stop layer. The etching-stop layer 107 is one of silicon nitride and silicon-oxy-nitride. The fourth dielectric layer 108 is tetra-ethyl-orthosilicate (TEOS). The first recess pattern 105 is a second dielectric layer 106. The third conductive layer 111 is a word-line. The word-line 111 is one selected from a group consisting of W, Al—Cu, Cu, TiSi, TiN, TaSi, TaN, WN, and WNSi.

Figure 8:
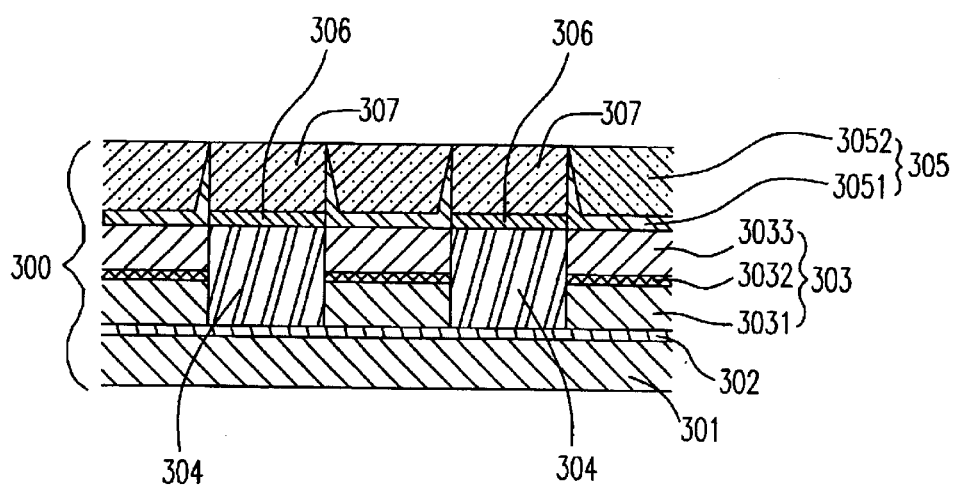
FIG. 8 is the schematic diagram of a semi-conductor structure manufactured according to the proposed method.

Please refer to FIG. 8. The structure of a cell stack 300 includes a substrate 301, an oxide layer 302, a first stack 303 having a first conductive layer 3031, a first dielectric layer 3032 and a second conductive layer 3033, a second dielectric layer 304 deposited around the first stack 303, a second stack 305 having a third conductive layer 3052 and a barrier layer 3051 connected to the first stack 303, a third dielectric layer 306 deposited around the second stack 305, and a fourth dielectric layer 307 deposited on the third dielectric layer 306.

Please refer to FIG. 8. The substrate 301 is a silicon substrate. The oxide layer 302 is a gate oxide. The first conductive layer 3031 is a floating gate. The floating gate 3031 is one selected from a group consisting of poly-silicon, amorphous silicon, and polycide. The second conductive layer 3033 is a control gate. The control gate 3033 is one selected from a group consisting of poly-silicon, amorphous silicon, and polycide. The structure of a cell stack 300 further includes a first dielectric layer 3032 deposited between the first conductive layer 3031 and the second conductive layer 3033. The first dielectric layer 3032 is an ONO layer. The first dielectric layer 3032 is a film stack composed of silicon dioxide, silicon nitride, and silicon dioxide. The third conductive layer 3052 is a word-line. The word-line 3052 is one selected from a group consisting of W, Al—Cu, Cu, TiSi, TiN, TaSi, TaN, WN, and WNSi. The barrier layer 3051 is a barrier metal layer for connecting the second conductive layer 3033 and the third conductive layer 3052. The barrier metal layer 3051 is one of TiN and a stack of TiN and Ti. The third dielectric layer 306 is an etching-stop layer. The etching-stop layer 306 is one of SiN and SiON. The fourth dielectric layer 307 is tetra-ethyl-ortho-silicate (TEOS).

Although the present invention has been described and illustrated in an example of the most preferred embodiment, however, the constructional characteristics of the present invention are not limited by that. The variations and modifications that anyone who is familiar with the skill can think of easily which fall within the spirit and scope of the present invention as defined by the appended claims should be included.

What is claimed is:

1. A cell stack, comprising:
   a substrate;
   an oxide layer;
   a first stack having a first conductive layer, a first dielectric layer, and a second conductive layer;
   a second dielectric layer deposited around said first stack and commonly forming a planar top with said first stack;
   a second stack having a third conductive layer and a barrier layer connected to said first stack;
   a third dielectric layer deposited around said second stack; and
   a fourth dielectric layer deposited on said third dielectric layer.

2. The cell stack according to claim 1, wherein said substrate is a silicon substrate.

3. The cell stack according to claim 1, wherein said oxide layer is a gate oxide.

4. The cell stack according to claim 1, wherein said first conductive layer is one selected from a group consisting of poly-silicon, amorphous silicon, and polycide.

5. The cell stack according to claim 1, wherein said second conductive layer is one selected from a group consisting of poly-silicon, amorphous silicon, and polycide.

6. The cell stack according to claim 1, wherein said cell stack further comprises a first dielectric layer deposited between said first conductive layer and said second conductive layer.

7. The cell stack according to claim 6, wherein said first dielectric layer is an ONO layer.

8. The cell stack according to claim 1, wherein said third dielectric layer is one of silicon nitride and silicon-oxy-nitride.

9. The cell stack according to claim 1, wherein said third conductive layer is one selected from a group consisting of W, Al—Cu, Cu, TiSi, TiN, TaSi, TaN, WN, and WNSi.

10. The cell stack according to claim 1, wherein said barrier layer is one of TiN and a stack of TiN and Ti.

11. The cell stack according to claim 1, wherein said fourth dielectric layer is tetra-ethyl-ortho-silicate (TEOS) oxide.

* * * * *